United States Patent [19]

Margala et al.

[11] 3,824,483

[45] July 16, 1974

[54] DIGITAL DEVICE FOR FAST FREQUENCY CONTROL OF A FREQUENCY SYNTHESIZER

[75] Inventors: Jean Pierre Margala; Jean Louis Roger Cassany, both of Paris, France

[73] Assignee: International Electric Corporation, New York, N.Y.

[22] Filed: July 20, 1973

[21] Appl. No.: 381,291

[30] Foreign Application Priority Data

July 27, 1972 France .............................. 72.27049

[52] U.S. Cl. ........................ 331/1 A, 331/17, 331/25

[51] Int. Cl. ............................................ H03b 3/04

[58] Field of Search .................. 331/1 A, 17, 18, 25

[56] References Cited

UNITED STATES PATENTS

| | | | |
|---|---|---|---|
| 3,375,448 | 3/1968 | Newman et al | 331/25 X |
| 3,484,712 | 12/1969 | Foote et al | 331/1 A X |
| 3,551,826 | 12/1970 | Sepe | 331/1 A X |

*Primary Examiner*—Herman Karl Saalbach
*Assistant Examiner*—Siegfried H. Grimm
*Attorney, Agent, or Firm*—John T. O'Halloran; Menotti J. Lombardi, Jr.; Alfred C. Hill

[57] ABSTRACT

This relates to a phase locked loop voltage controlled digital synthesizer in which digital pulses produced from a voltage controlled oscillator (VCO) and a first frequency divider and a reference oscillator and a second frequency divider are applied to a comparator which produces an output signal when the compared pulses have repetition frequencies which are not equal. The comparator output signal results in a voltage which is applied to the VCO to change the frequency thereof in steps until repetition frequency equality is achieved. The purpose of the present invention is to shorten the time needed to cause the repetition frequency of the pulses at the output of the first frequency divider to equal the repetition frequency of the pulses at the output of the second frequency divider. This is accomplished by including a reversible counter connected to the comparator output. The output signal of the reversible counter is connected to a digital-to-analog converter to produce the VCO control voltage. In addition, two other control circuits are provided for each of the first frequency divider and the second frequency divider which cooperate with the reversible counter in reducing the time of achieving repetition frequency equality.

7 Claims, 3 Drawing Figures

DIGITAL DEVICE FOR FAST FREQUENCY CONTROL OF A FREQUENCY SYNTHESIZER

BACKGROUND OF THE INVENTION

The present invention relates to a digital device for fast presetting the frequency of a controlled oscillator for use particularly in frequency synthesizers.

It is known that a synthesizer basically is an apparatus producing one of the spectrum lines of a discontinuous spectrum comprising predetermined stable frequencies which are a multiple of a reference frequency $f_B$.

In modern synthesizers, so-called "direct division synthesizers," the spectrum is mostly produced from a voltage controlled oscillator (VCO) having a frequency $F_A$ controlled by a voltage and divided by N by a variable ratio divider. The signal, at the so-called analysis frequency $f_A = F_A/N$, has its frequency and phase compared with those of a reference frequency signal $f_B$ by means of two comparators, the output voltages of which are applied to the VCO so that the oscillator frequency is controlled to achieve the value $F_o = Nf_B$, the first voltage corresponding to a coarse presetting and the second one to a fine setting providing the synchronization.

In synthesizers, particularly in those used in radio navigation aids, once the division ratio N is selected for producing oscillation frequency $F_o = Nf_B$, the frequency comparator and the control loop associated thereto, which performs the presetting, must have a very short operation time or acquisition so as to adjust as fast as possible the VCO voltage from its initial value, which determines a frequency $F_A$, to its final value which determines the desired frequency $F_o = Nf_B$.

Usually, in the known prior art, the presetting voltage and therefore frequency $F_A$ does not vary continuously during the acquisition period but discontinuously step by step so that the phase comparator must relieve the frequency comparator to correct the gaps between $F_A$ and $F_o$ which are less than a frequency step F.

The digital presetting devices, presently used in direct division synthesizers, are arranged and operate according to the following basic principles.

The frequency comparator receives analysis pulses at frequency $f_A = FA/N$ and reference pulses $f_B$ (for a better understanding, it will be assumed that initially $F_A/N > f_B$). Each time two successive analysis pulses are between two successive reference pulses, the comparator produced a so-called correction pulse which is registered in a counter. By means of a digital-to-analog converter associated with said counter, for each new registered correction pulse, the voltage applied to the VCO varies by a voltage step and the frequency $F_A$ varies by the corresponding frequency step $F$ which is assumed substantially higher than $f_B$.

Initially, the counter is in a position corresponding, for example, to the maximum frequency of the VCO band, i.e., $F_2 = N_2 f_B$, the minimum frequency being $F_1 = N_1 f_B$.

The division ratio is set in the variable ratio divider or DRV which corresponds, after a stabilization period to a frequency $F_o = Nf_B$.

First, the VCO oscillates at the maximum frequency $N_2 f_B$. The analysis frequency from DRV, i.e., $N_2 f_B/N$, is compared with the frequency $f_B$.

A correction pulse is registered in the counter after a time of approximately $(N_2 f_B/N - f_B)^{-1}$. Due to this pulse, a frequency step $\Delta F$ is made and the analysis frequency becomes $N_2 f_B - \Delta F/N$. After a time of approximately $(N_2 f_B - \Delta F - f_B)^{-1}$, a second correction pulse is registered and so on up to $N_2 f_B - k\Delta F/N$ being less than or equal to $F$. For the kth correction pulse the analysis frequency is approximately: $N_2 f_B - k\Delta F = f_B/N$ or resulting in: $k = (N_2 - N)/\Delta F f_B = F_2 - F_o/\Delta F$. The maximum value of $k$ is: $k_m = (N_2 - N_1)/\Delta F f_B = F_2 - F_1/\Delta F (N_2 - N_1)$ represents the total frequency band produced by the VCO and $k_m$ measures the number of voltage steps applied to the VCO or in other words the correction counter capacity. From the previous analysis, it results that correction pulses are spaced more and more in the time when approaching the desired frequency $F_o = Nf_B$ and the maximum interval $t_m$ is approximately $N/\Delta F = 1/f_B \times F_o/\Delta F$.

In a general manner, taking into account the sum of the spacings between the successive correction pulses, the acquisition time $T_a$ is written in the mentioned assumption:

$$T_a = \frac{1}{f_B} \times \frac{F_o}{\Delta F} \sum_{p=m}^{p=k} \frac{1}{p} = \frac{1}{f_B} \times \frac{F_o}{\Delta F} (\text{Log } k + s)$$

(Formula (A))

$s$ being a decreasing function of $k$ which varies from $s = 1$, for $k = 1$, to $s = 0.566$, for $k$ higher than 10.

An example based on synthesizer techniques utilized in radio navigation equipment will be employed to define the various parameters. The frequency range goes from 56 to 100 MHz (magahertz), with 7,000 channels and frequency spacings $f_B = 6.25$ kHz (kilohertz). If $k_m = 500$, $F$ is 87.5 kHz.

With $F_2 = 100$ MHz, the maximum spacing $t_m = 1/f_B \times F_o/\Delta F = 180$ ms (milliseconds) and the value of $T_a$ from $F_2$ to $F_1$ is 0.8 sec. (seconds) according to the formula (A).

Assuming that the counter is in an initial position corresponding to the minimum frequency of the VCO range: $F_1 = N_1 f_B$. Employing the mathematics as hereinabove an acquisition time $T'_a$ is:

$$T'_a = 1/f_B \times F_o/\Delta F\ (\text{Log } k + s)$$

(Formula (B))

with $k = F_o - F_1/\Delta F$ instead of $F_2 - F_o/\Delta F$ as in Formula (A).

With previous example of figures, the value $T'_a$ from $F_1$ to $F_2$ is 1.3 sec. according to the formula (B).

Acquisition time as long as these values are considered prohibitive in certain modern equipment designed for navigation aids.

It should be noted that the following condition may occur when the correction counter is a conventional progressive counter. Indeed, if frequency $F_o$ selected by coding DRV is higher than the initial VCO $F_A$, while being very close to it, the correction counter must perform a complete counting cycle having a duration substantially equal to $(T_a)_{max}$. This condition may be detrimental to the operation when the operator must select very close channels.

Such a drawback may be to certain extend avoided by using a reversible counter which permits limiting acquisition time between two frequencies spaced by $(+\Delta F)$ to a maximum spacing $t_m$.

SUMMARY OF THE INVENTION

An object of the present invention is to provide a digital device for a fast presetting of the controlled oscillator which has an acquisition time $T_a$ very much shorter than the acquisition time of known devices.

A feature of the present invention is the provision of a digital device for frequency control of a frequency synthesizer comprising: a voltage controlled oscillator to produce pulses having a frequency control input; a first counter-divider having a variable division ratio, an input, an output and a reset input; a highly stabilized oscillator to produce pulses; a second counter-divider having a given division ratio, an input, an output and a reset input; a frequency comparator having two inputs, an up count output, a down count output and two other outputs, each of the inputs of the comparator being coupled to the output of a different one of the first and second counter-divider; a reversible counter having an up count input coupled to the up count output of the comparator, a down count input coupled to the down count output of the comparator and outputs; a digital-to-analog converter having inputs coupled to the outputs of the reversible counter and an output coupled to the control input of the voltage controlled oscillator; first means coupled between the output of the voltage controlled oscillator and the input of the first counter and coupled to the output of the first counter-divider; second means coupled between the output of the stabilized oscillator and the input of the first counter and coupled to the output of the second counter-divider; third means coupled between the output of the voltage controlled oscillator and the reset input of the first counter-divider and coupled to one of the two other outputs of the comparator; and fourth means coupled between the output of the stabilized oscillator and the reset input of the second counter-divider and coupled to the other of the two other outputs of the comparator.

Initially, it is assumed that a counter is in a position corresponding, for example, to the maximum frequency range of the VCO : $F_2 = N_2 f_B$.

The DRV is set to a ratio N corresponding to a frequency $F_o = N f_B$ after stabilization.

First the VCO oscillates at the maximum frequency $N_2 f_B$. After a time close to $N/N_2 f_B$, a correction pulse is registered and counted up. Due to this pulse, a frequency step $\Delta F$ is performed. The VCO frequency becomes $N_2 f_B - \Delta F$ and, after a time close to $N/N_2 f_B - \Delta F$, a second correction pulse is registered and counted up, and so on, up to $N_2 f_B - k \Delta F = N f_B = F_o$. The pulse number $k$ leading to $f_A = f_B$, to a $\Delta F$ is therefore determined by the relations:

$$k = (N_2 - N)/\Delta F\, f_B = F_2 - F_o/\Delta F$$

It should be noted that maximum spacing $t_m$ is reached when $f_A = f_B$ and is equal to $1/f_B$. The acquisition time $T_a$ is:

$$T_a \quad N \sum_{p=0}^{p=k} \frac{1}{N_2 f_B - p\Delta F}$$

which is approximately, when $k$ is a rather large number:

$$T_a = 1/f_B \times F_o/\Delta F \times \text{Log}\, F_2/F_o$$

(Formula (C))

Considering again the figures of the above mentioned embodiment with $f_B = 6.25$ kHz and $\Delta F = 87.5$ kHz, the maximum acquisition time from 100 down to 56 MHz is 60 ms:

This means that, other things being equal, the acquisition time is twelve times shorter than the maximum acquisition time in known devices.

If the assumption is made that initially the counter is in the position corresponding, for example, to the minimum frequency of the VCO frequency band: $F_1 = N_1 f_B$, the acquisition time computation is made in the same manner as previously and in this case correction pulses are counted down.

Acquisition time is then written:

$$T'_a = 1/f_B \times F_o/\Delta F \times \text{Log}\, F_o/F_1$$

(Formula (D))

Considering again the figures of the above mentioned embodiment, the acquisition time $(T'_a)_{max}$ is found equal to 100 ms, which is still an acquisition time twelve times shorter than that of known devices, other things being equal.

From formulas (C) and (D), it results that the spacing between correction pulses increases from $N/N \times 1/f_B$ to $1/f_B$, when the pulse counter has an initial position corresponding to the minimum VCO frequency, and that it decreases from $N/N \times 1/f_B$ to $1/f_B$, in the other considered case. This explains the dissymmetry of the acquisition times $(T_a)_{max}$ and $(T'_a)_{max}$.

It should be noted, to make the magnitude range clear, that $T'_a = T_a$, when frequency $F_o$ is $\sqrt{F_1 F_2}$ which is in the above mentioned embodiment: $F_o = 75$ MHz and $T_a = T'_a = 40$ ms.

In the same conditions, known prior art devices would have an acquisition time of about 0.8 sec.

BRIEF DESCRIPTION OF THE DRAWING

Above-mentioned and other features and objects of this invention will become more apparent by reference to the following description taken in conjunction with the accompanying drawing, in which.

DESCRIPTION OF THE PREFERRED EMBODIMENT

DESCRIPTION OF FIG. 1

Figure 1:
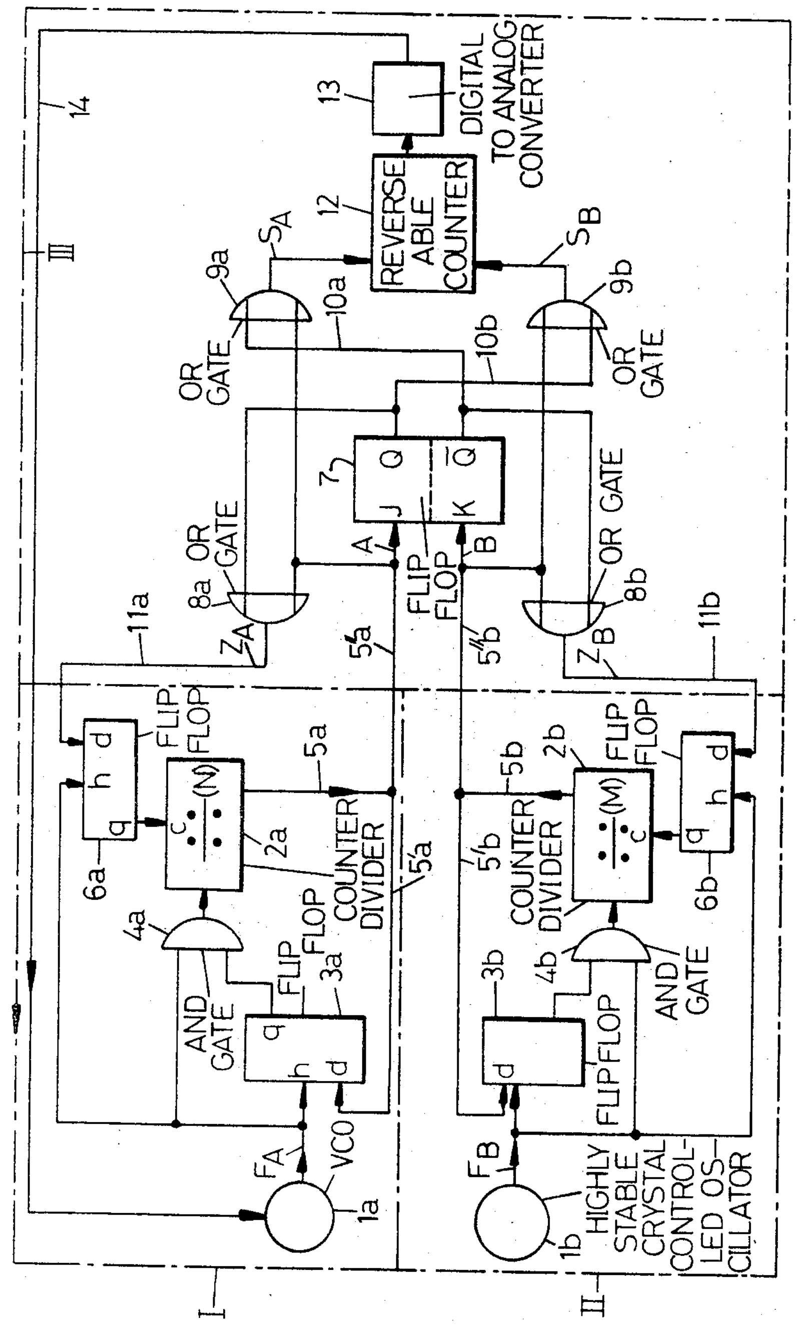
FIG. 1 is a block diagram of a frequency synthesizer using the fast presetting digital device according to the principles of this invention.

In the block I, defined by a first dot-and-dash line frame, is shown the circuit which generates output pulses at analysis frequency $f_A$ from input pulses at frequency $F_A$.

In the block II, defined by a second dot-and-dash line frame, is shown a circuit similar that of block I which generates output pulses at reference frequency $f_B$ from input pulses at frequency $F_B$.

In the block III, defined by a third dot-and-dash frame, is shown the comparator of frequencies $f_A$ and $f_B$, as well as the up-down or reversible counter and the digital-to-analog converter.

CIRCUIT SHOWN IN BLOCK I IN FIG. 1

1*a* is a voltage controlled oscillator (VCO) which delivers pulses at frequency $F_A$. Output pulses from 1*a* are respectively applied to pulse inputs *h* of two flip-flops 3*a* and 6*a*, and to one of the two inputs of an AND gate 4*a*.

Each of the flip-flops 3*a* and 6*a* is a delay flip-flop, that is the logic level at output *q*, following a pulse applied to input *h*, is equal to that applied to a special input *d*.

Output *q* of flip flop 3*a* is connected to the second input of the gate 4*a*. The output of gate 4*a* is connected to the pulse input of a counterdivider 2*a* which basically is a variable ratio divider of ratio 1/N wherein the value of N is preset by convenient data input, according to a known technique. When N pulses at frequency $F_A$ have been counted after a reset of counter-divider 2*a*, the output of counter-divider 2*a* is at binary level "O."

The output of counter-divider 2*a* is connected, on the one hand, to a junction point A of the circuit shown in block III, via connections 5*a* and 5''*a* and, on the other hand, to input d of flip flop 3*a* via connections 5*a* and 5'*a*.

Input *d* of flip flop 6*a* is connected, via connection 11*a*, to the circuit shown in block III.

Output *q* of flip flop 6*a* is connected to a reset input C of counter-divider 2*a*. When binary level "O" is applied to input C of counter-divider 2*a*, counter-divider 2*a* resumes counting from O to N at the next pulse at frequency $F_A$.

Taking into account the arrangement of flip flop 3*a* and gate 4*a*, the occurrence of level "O" at the output of counter-divider 2*a* results in switching AND gate 4*a* off and stopping counting in counter-divider 2*a* after the occurrence of the next pulse, at frequency $F_A$, from output of VCO 1*a*, counter-divider 2*a* remaining locked at the count value N.

In these conditions, it will be noted that, if input *d* of flip flop 6*a* is at level "O," pulses at analysis frequency $f_A = F_A/N$ from the output of counter-divider 2*a* have a pulse width of about $1/F_A$. On the other hand, if input *d* of flip flop 6*a* is at binary level "1," pulses at frequency $F_A$ have a pulse width equal to $1/F_A$ plus the holding time at level "1" of input *d* of flip flop 6*a*.

It should be noted that VCO 1*a* is supplied by a wire 14 from the circuit shown in block III.

CIRCUIT SHOWN IN BLOCK II IN FIG. 1

Elements of block II are similar to the elements of block I and are indicated by the same numerical references plus the indicator *b*, except for the following differences:

1*b* is a high-stable crystal-controlled oscillator, for example, which generates pulses at frequency $F_B$, the counter-divider 2*b* divides $F_B$ by M and delivers output pulses at reference frequency $f_B = F_B/M$, there is no wire similar to the wire 14 which connects the circuit shown in block III to that shown in block I, Output of counter-divider 2*b* is connected, via connections 5*b* and 5''*b* to a junction B of the circuit shown in block III.

CIRCUIT SHOWN IN BLOCK III, FIG. 1

This circuit practically includes a dissymmetric flip-flop 7 having two data inputs J and K and two outputs Q and $\overline{Q}$. It will be assumed, without becoming specific, that control pulse in the form of a passage from level "O" to level "1" applied to data inputs J and K separately and alternately, cause flip-flop 7 to change its conditions.

Moreover, according to a well known feature of J-K flip-flops, it also changes its condition if two control pulses occurred simultaneously at the two inputs J and K.

Junction A is connected to input J of flip flop 7 and junction B to input K.

Junction A is also connected via a branch of 5''*a* to one of the two inputs of an OR gate 8*a* whose other input is connected to output Q of flip flop 7. Similarly, junction B is also connected by a branch of 5''*b* to one of the two inputs of an OR gate 8*b*, whose other input is connected to output $\overline{Q}$ of flip flop 7.

Outputs $Z_A$ and $Z_B$ of gates 8*a* and 8*b* are respectively connected via connections 11*a* and 11*b* to input *d* of flip-flops 6*a* and 6*b*, in blocks I and II.

Via another branch of 5''*a* junction point A and via connection 10*a* output $\overline{Q}$ of flip flop 7 are connected to the two inputs of an OR gate 9*a*. Similarly, via another branch of 5''*b* junction B and via connection 10*b* output Q of flip flop 7 are connected to the two inputs of an OR gate 9*b*.

Outputs $S_A$ and $S_B$ of gates 9*a* and 9*b* are connected to an up-count input and to a down-count input of the reversible counter 12 of a known type. The outputs of counter 12 are connected to a digital-to-analog converter 13 which converts the total number of pulses stored in counter 12 into a voltage level which is applied to VCO 1*a* in block I via wire 14.

In the following, it will be assumed, without being specific, that pulses are either counted up or down, in time $S_A$ or $S_B$ goes from level "1" to level "O."

OPERATION OF THE DEVICE SHOWN IN FIG. 1

A preliminary consideration must be made. It has been experienced that, for a correct operation of the device, level changes of $Z_A$, $Z_B$, $S_A$ and $S_B$ must occur a certain time after level changes which have caused them. To do so, it is convenient to delay, particularly between junction point A (or B) and input J (or K) of flip flop 7 as well as after outputs Q and Q of flip flop 7.

Typically, in most of the case, these delays have not to be implemented in the form of individuad components because they ineerently exist due to inherent delays of flip flop 7 and gates 8*a*, 8*b*, 9*a* and 9*b*. However, if those inherent delays are not long enough, additional delays may always be added which are perfectly determined between junction points A and J, (and between B and K) and after outputs Q and Q of flip flop 7, in the form of delay line or monostable circuits.

The operation of block III will be better understood if the "verity equations" concerning the junction points $Z_A$, $Z_B$, $S_A$ and $S_B$ are written first, logic functions being the levels (or conditions) at those points and the logic variables being the level (or conditions) at points A, B, Q and $\overline{Q}$. For reasons of convenience, the logic levels (or condition) will be indicated by the same letters as the involved points.

The operator "Or" will be indicated by the sumbol +. These "verity equations" are written:

$$Z_A = A + Q \quad (1)$$

$$Z_B = B + \overline{Q} \quad (2)$$

$$S_A = A + \overline{Q} \quad (3)$$

$$S_B = B + Q \quad (4)$$

Combining (1) and (2) results in: $Z_A + Z_B = 1$. This means that $Z_A$ and $Z_B$ cannot be in the conditions "O" at the same time. Therefore, at any time, at least one of the counter-dividers 2*a* and 2*b* is either operative or unoperative.

Combining (3) and (4) results in: $S_A + S_B = 1$ and, therefore, $S_A$ and $S_B$ cannot be in the condition "O" at the same time. In other words, there cannot be, at the same time, up counting and down counting in the reversible counter 12. In addition, when $S_A$ and $S_B$ are in condition "1," counter 12 is unoperative which is the case when A and B are at level "1" (no pulse at frequency $f_A$ and $f_B$ applied to A and B, respectively).

Combining (1) and (3) results in: $Z_A + S_A = 1$. This means that $Z_A$ and $S_A$ cannot be at level "O" at the same time. Therefore, the reset of counter-divider 2*a* can only occur after level "O" has disappeared on output connection 5*a*, that level "O" prevents pulses at frequency $F_B$ from being applied to the input of counter-divider 2*a*, via flip-flop 3*a* and AND gate 4*a*.

Combining equation (2) and (4) results in: $Z_B + S_B = 1$, which causes similar considerations concerning operation of block II.

Figure 2:
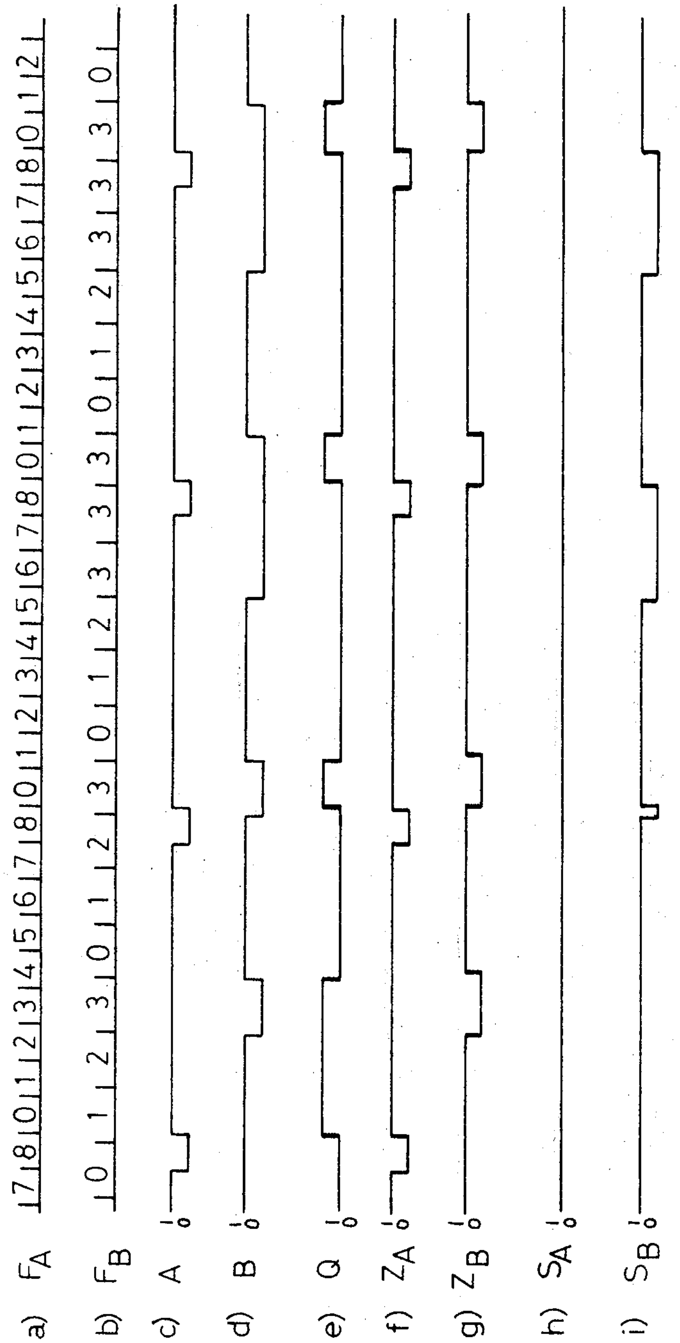
FIG. 2 shows waveforms at various junction points of the circuit shown in FIG. 1, when frequencies $f_A$ and $f_B$ are not equal.

The operation of the device shown in FIG. 1 will be well illustrated by referring to the waveforms shown in FIG. 2 concerning junction points A, B, Q, $Z_A$, $Z_B$, $S_A$ and $S_B$.

It will be assumed that counter-divider 2*a* (block I) divides by 9 ($N = 9$) and counter-divider 2*b* (block II) divides by 4 ($M = 4$).

Pulses, at frequency $F_A$ and $F_B$ are shown in FIG. 2 by Curves a) and b) made of vertical short lines corresponding to trailing edges, for instance. The figures written between pulses represent the numbers stored in counter-dividers 2*a* and 2*b*, that is from 0 to 8 for 2*a* and from 0 to 3 for 2*b*, respectively. Curves (c) and (d), respectively, represents pulses at frequency $f_A$ and $f_B$; that is level "O" or "1" at points A and B. It is reminded that occurrence of the pulses correspond to the passage from level "1" to level "O" and back to level "1."

Curves (e) to (i) represent respectively the level variation at points Q, $Z_A$, $Z_B$, $St_A$ and $S_B$.

It will be assumed that initially:

Q is at level "O"

$f_A < f_B$ pulse at frequency $f_A$ occurs before that at frequency $f_B$.

Tracing curves (c) to (i) is easily made by using equations 1 to 4 and by remembering that flip-flops 3*a* and 6*a* of block I as well as flip flop 3*b* and 6*b* of block II, are provided for delaying by a period $1/F_A$ or $1/F_B$, at the maximum, the blocking of the resetting of counter-dividers 2*a* and 2*b*.

If counter-divider 2*b* is, for instance, blocked, $Z_B$ must be at level "1" otherwise counter-divider 2*b* would turn back to zero and B to level "O" which implies that Q is at level "O" as well as $S_B$. As soon as Q is turned to level "1" due to the passage from "O" to "1" of level A, $Z_B$ is turned to condition "O" and $S_B$ to condition "1" and, via flip-flop 6*b*, counter-divider 2*b* is reset.

Tracing curves (e) and (i) has taken into account delay resulting from flip-flop 7 and gates 8*a*, 8*b*, 9*a* and 9*b* and those delays are illustrated by thicker vertical lines.

From FIG. 2, it appears that as soon as there is a coincidence for a certain time between two pulses at frequency $F_A$ and $F_B$ ($A = B =$ "O"), a permanent operation is established wherein pulses at ($f_B$) are enlarged so as to wait pulses, at lower frequency. It is to be noted that $S_A$ remains at level "1" while $S_B$ is turned to level "O" at the beginning of each pulse at frequency $f_B$. The reversible counter 12 is made to count down by a unit each time $S_B$ goes from level "1" to level "O." It will be noted that to be more specific, the width of correction pulses at $S_B$ is determined by the duration of which points Q and B are simultaneously in the condition "O." For that duration, counter-divider 2*b* is blocked.

Each pulse counted down changes the voltage applied to the VCO by one step and after a number of down pulses large enough according to the already mentioned principle, the two frequencies $f_A$ and $f_B$ become equal.

Other initial conditions may be assumed, always with $f_A < f_B$. For instance, at the beginning, Q may be in the condition "1" or pulses at frequency $f_B$ may precede that at frequency $f_A$. The waveforms at the various junction points of FIG. 1 may be considered in the same manner as previously and roughly, it will be noted that after a transitory operation having a duration at least equal to $2/f_A$, a permanent operation is established which is similar to that illustrated in FIG. 2.

It may be easily conceived that, if $f_A > f_B$, the same waveforms are found again for a permanent operation, $S_B$ remaining at level "1" while $S_A$ is turning from the level "O" at the beginning of each pulse at frequency $f_A$. The reversible counter 12 performs an up counting of one unit for each passage of $f_A$ from level "1" to level "O." Each pulse counted up changes the voltage applied to VCO by one pulse and, after a sufficient pulse number, the two frequencies $f_A$ and $f_B$ are equal.

Figure 3:
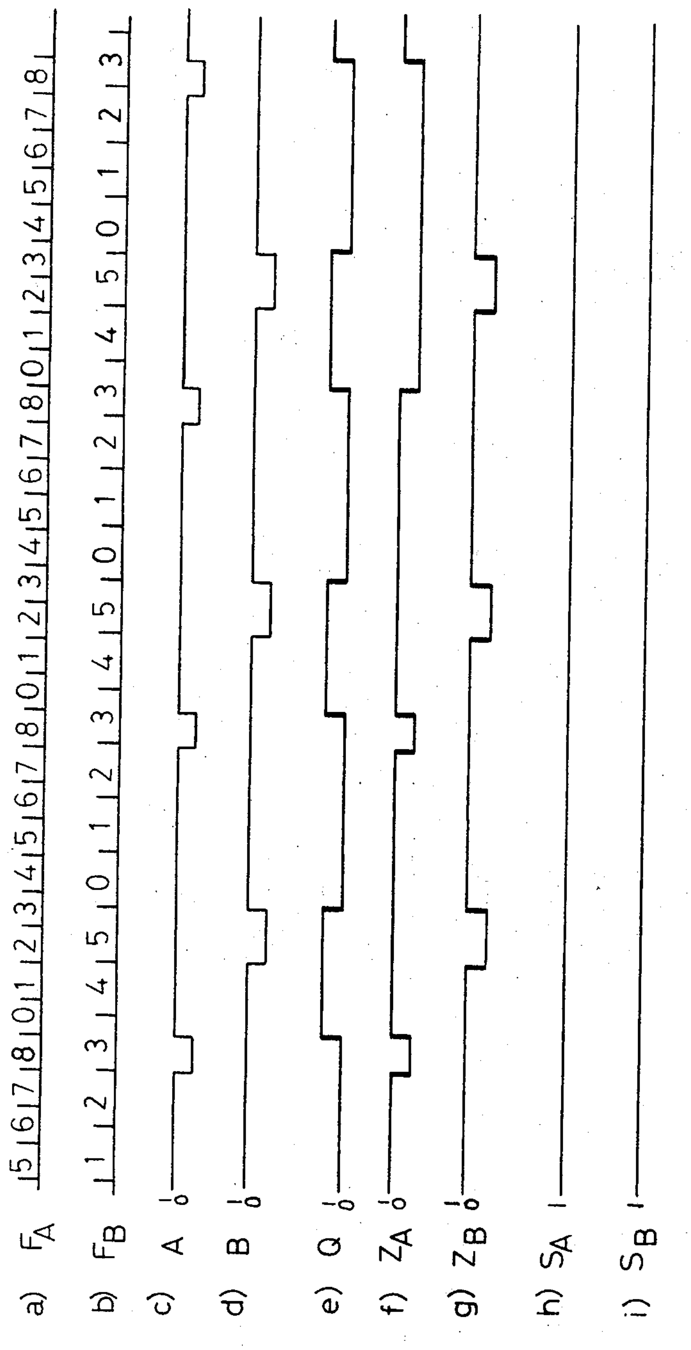
FIG. 3 shows waveforms similar to FIG. 2, when frequencies $f_A$ and $f_B$ are equal.

It is now suitable to consider the waveforms in the case when the two frequencies $f_A$ and $f_B$ are equal. The curves (a) to (i) shown in FIG. 3 illustrate these waveforms. It is to be noted that $S_A$ and $S_B$ remain at level "1" and the reversible counter 12 remains at rest.

While we have described above the principles of our invention in connection with specific apparatus it is to be clearly understood that this description is made only by way of example and not as a limitation to the scope of our invention as set forth in the objects thereof and in the accompanying claims.

We claim:

1. A digital device for frequency control of a frequency synthesizer comprising:
a voltage controlled oscillator to produce pulses having a frequency control input;
a first counter-divider having a variable division ratio, an input, an output and a reset input;
a highly stabilized oscillator to produce pulses;
a second counter-divider having a given division ratio, an input, an output and a reset input;
a frequency comparator having two inputs, an up count output, a down count output and two reset outputs, each of said inputs of said comparator being coupled to said output of a different one of said first and second counter-divider;
a reversible counter having an up count input coupled to said up count output of said comparator, a down count input coupled to said down count output of said comparator and outputs;
a digital-to-analog converter having inputs coupled to said outputs of said reversible counter and an output coupled to said control input of said voltage controlled oscillator;
first means coupled between the output of said voltage controlled oscillator and said input of said first counter-divider and coupled to said output of said first counter-divider to provide input pulses to be frequency divided by said first counter-divider;
second means coupled between the output of said stabilized oscillator and said input of said second counter-divider and coupled to said output of said second counter-divider to provide input pulses to be frequency divided by said second counter-divider;
third means coupled between the output of said voltage controlled oscillator and said reset input of said first counter-divider and coupled to one of said two reset outputs of said comparator to reset said first counter-divider; and
fourth means coupled between the output of said stabilized oscillator and said reset input of said second counter-divider and coupled to the other of said two reset outputs of said comparator to reset said second counter-divider.

2. A device according to claim 1, wherein
each of said first and second means include
a first delay flip flop having an output, a data input coupled to said output of an associated one of said first and second counter-dividers and a clock input coupled to the output of an associated one of said voltage controlled oscillator and said stabilized oscillator, and
a two input AND gate having one of its inputs coupled to the output an associated one of said voltage controlled oscillator and said stabilized oscillator, the other of its inputs coupled to said output of said first delay flip flop and its output coupled to said input of an associated one of said first and second counter-dividers.

3. A device according to claim 2, wherein
said comparator includes
a J-K flip flop having a J input, a K input, a Q output and a $\overline{Q}$ output, said J input being coupled to said output of said first counter-divider and said K input being coupled to said output of said second counter-divider,
a first two input OR gate having one of its inputs coupled to said output of said first counter-divider, the other of its inputs coupled to said Q output and its output coupled to said third means,
a second two input OR gate having one of its inputs coupled to said output of said second counter-divider, the other of its inputs coupled to said $\overline{Q}$ output and its output coupled to said fourth means,
a third two input OR gate having one of its inputs coupled to said output of said first counter-divider, the other of its inputs coupled to said $\overline{Q}$ output and its output coupled to said up count input of said reversible counter, and
a fourth two input OR gate having one of its inputs coupled to said output of said second counter-divider, the other of its inputs coupled to said Q output and its output coupled to said down count input of said reversible counter.

4. A device according to claim 3, wherein
each of said third and fourth means include
a second delay flip flop having a data input coupled to the output of an associated one of said first and second OR gates, a clock input coupled to the output of an associated one of said voltage controlled oscillator and said stabilized oscillator and an output coupled to said reset input of an associated one of said first and second counter-dividers.

5. A device according to claim 1, wherein
said comparator includes
a J-K flip flop having a J input, a K input, a Q output and a $\overline{Q}$ output, said J input being coupled to said output of said first counter-divider and said K input being coupled to said output of said second counter-divider,
a first two input OR gate having one of its inputs coupled to said output of said first counter-divider, the other of its inputs coupled to said Q output and its output coupled to said third means,
a second two input OR gate having one of its inputs coupled to said output of said second counter-divider, the other of its inputs coupled to said $\overline{Q}$ output and its output coupled to said fourth means,
a third two input OR gate having one of its inputs coupled to said output of said first counter-divider, the other of its inputs coupled to said $\overline{Q}$ output and its output coupled to said up count input of said reversible counter, and
a fourth two input OR gate having one of its inputs coupled to said output of said second counter-divider, the other of its inputs coupled to said Q output and its output coupled to said down count input of said reversible counter.

6. A device according to claim 5, wherein
each of said third and fourth means include
a second delay flip flop having a data input coupled to the output of an associated one of said first and second OR gates, a clock input coupled to the output of an associated one of said voltage controlled oscillator and said stabilized oscillator and an output coupled to said reset input of an associated one of said first and second counter-dividers.

7. A device according to claim 1, wherein
each of said third and fourth means include a delay flip flop having a date input coupled to an associated one of said two other outputs of said comparator, a clock input coupled to the output of an associated one of said voltage controlled oscillator and said stabilized oscillator and an output coupled to said reset input of an associated one of said first and second counter-dividers.

* * * * *